United States Patent
Hasegawa

(10) Patent No.: US 6,888,432 B2
(45) Date of Patent: May 3, 2005

(54) LAMINATED SUBSTRATE, METHOD OF PRODUCING THE SAME, NONRECIPROCAL CIRCUIT ELEMENT, AND COMMUNICATION DEVICE

(75) Inventor: Takashi Hasegawa, Mattou (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/337,300

(22) Filed: Jan. 7, 2003

(65) Prior Publication Data

US 2003/0156379 A1 Aug. 21, 2003

(30) Foreign Application Priority Data

Feb. 15, 2002 (JP) ........................................ 2002-038736

(51) Int. Cl.⁷ .............................................. H01H 51/22
(52) U.S. Cl. ...................................... 335/78; 361/321.1
(58) Field of Search .............................. 361/303, 306.1, 361/306.2, 306.3

(56) References Cited

U.S. PATENT DOCUMENTS

| | | | | |
|---|---|---|---|---|
| 6,222,425 B1 | * | 4/2001 | Okada et al. ................. | 333/1.1 |
| 6,344,961 B1 | * | 2/2002 | Naito et al. ................... | 361/302 |
| 6,556,420 B1 | * | 4/2003 | Naito et al. ............... | 361/306.1 |
| 6,597,254 B2 | * | 7/2003 | Fujino et al. ................. | 333/1.1 |
| 6,606,237 B1 | * | 8/2003 | Naito et al. .............. | 361/306.3 |
| 6,678,145 B2 | * | 1/2004 | Naito et al. .............. | 361/308.1 |
| 2003/0085769 A1 | * | 5/2003 | Saito et al. ................... | 333/1.1 |

FOREIGN PATENT DOCUMENTS

| | | |
|---|---|---|
| JP | 7-15213 | 1/1995 |
| JP | 9-289402 | 11/1997 |

\* cited by examiner

*Primary Examiner*—Lincoln Donovan
*Assistant Examiner*—Bernard Rojas
(74) *Attorney, Agent, or Firm*—Keating & Bennett, LLP

(57) ABSTRACT

A laminated substrate includes a dielectric sheet having center electrode connecting electrodes, a dielectric sheet having ground connecting electrodes and viaholes, a dielectric sheet having hot-side capacitors, a circuit electrode, and a resistor disposed thereon, a dielectric sheet having hot-side capacitor electrodes disposed on the surface thereof, and dielectric sheets having ground electrodes disposed on the surfaces thereof, respectively. The laminated substrate includes matching capacitors and a terminal resistor disposed inside thereof. The matching capacitors are trimmed before the matching capacitors are connected to center electrodes, respectively.

14 Claims, 16 Drawing Sheets

LAMINATED SUBSTRATE, METHOD OF PRODUCING THE SAME, NONRECIPROCAL CIRCUIT ELEMENT, AND COMMUNICATION DEVICE

BACKGROUND OF THE INVENTION

1. Field of the Invention

The present invention relates to a laminated substrate, a method of producing the laminated substrate, a nonreciprocal circuit element, and a communication device.

2. Description of the Related Art

Related art nonreciprocal circuit elements such as circulators, isolators, and so forth have characteristics such that they transmit electric power only in a predetermined direction and do not transmit an electric power in the transverse direction. For example, the isolators are used in mobile communication devices such as mobile telephones and portable telephones by utilization of the above-described characteristics.

As described in Japanese Unexamined Patent Application Publication No. 9-289402, for some of the above-described nonreciprocal circuit elements, desired electrical characteristics are obtained by trimming the capacitor electrodes of matching capacitors disposed on the surfaces of laminated substrates. In the nonreciprocal circuit elements, a matching capacitor is trimmed after the matching capacitor is connected to a center electrode. Since the capacitor electrode is covered with the center electrode, the area of a portion of the matching capacitor which can be trimmed is decreased, so that the range of the electrical characteristics can be adjusted becomes small. In particular, in recent years, nonreciprocal circuit elements for use in mobile communication devices have been further reduced in size, and the electrode areas of the matching capacitors have been further reduced in size. Thus, it is a problem that the areas of the capacitor electrode which can be trimmed become small. The trimming for adjustment of the electrical characteristic is carried out after the nonreciprocal circuit element is constructed. Therefore, if the trimming process fails, not only the laminated substrate but also the other elements such as a ferrite and a center electrode will be useless. The production cost of the nonreciprocal circuit element is thus increased.

Accordingly, to solve the above-described problems, a nonreciprocal circuit element (isolator) has been proposed which includes a laminated substrate 330 having matching capacitors C1 to C3 provided thereon as shown in FIG. 15, a ferrite having center electrodes disposed thereon to be mounted on the laminated substrate 330, a permanent magnet, and a metallic case covering these elements. In this nonreciprocal circuit element, the matching capacitors C1 to C3 are trimmed before the matching capacitors C1 to C3 are connected to the center electrodes.

More specifically, the laminated substrate 330 includes a dielectric sheet 342 having hot-side capacitor electrodes 371a to 373a, ground connecting electrodes 331, a circuit electrode 317, a resistor 375, and viaholes 318 formed in the surface thereof, a dielectric sheet 344 having hot-side capacitor electrodes 371a to 373b disposed on the surface thereof, and dielectric sheets 343 and 345 each having a ground electrode 374 disposed on the surface thereof. Moreover, a ground electrode to be soldered to the metallic case is disposed on the back surface of a dielectric sheet 345. While the laminated substrate 330 is in the state of a single member, trimming grooves are formed in the capacitor electrodes 371a, 372a, and 373a provided on the surface of the laminated substrate 330. The trimming is carried out in such a manner that the capacitor electrodes 371a to 373a are cut and separated. Accordingly, the above-described problems of the nonreciprocal circuit element according to Japanese Unexamined Patent Application Publication No. 9-289402 can be solved.

However, regarding the nonreciprocal circuit element having the laminated substrate 330 shown in FIG. 15, the trimming capacitor electrodes 371a to 373a are electrically connected to the center electrodes by use of a connecting material such as solder paste or electroconductive paste after the capacitor electrodes 371a to 373a are trimmed. This causes problems in that a part of the trimming grooves 380 may be filled with and embedded by the connecting material, so that the cut and separated trimming capacitor electrodes 371a to 373a are connected again. Especially, when the trimming is carried out so as to cut and separate the capacitor electrodes 371 to 373 by a laser, it is very probable that the trimming grooves are shortened, since the widths of the trimming grooves 380 are small, that is, are in the range of 10 μm to 100 μm. If the electrodes are partially cut, and the unnecessary portions are completely removed, a short circuit condition can be prevented. However, in this case, the trimming time is very long.

Moreover, the hot-side capacitor electrodes 371a to 373a are positioned near the ground connecting electrodes 331. Thus, it is very probable that they are short-circuited in addition to the trimming grooves 380.

SUMMARY OF THE INVENTION

In order to overcome the problems described above, preferred embodiments of the present invention provide a laminated substrate which is small in size and has high quality performance and a high reliability, and also provide a nonreciprocal circuit element, and a communication device.

According to a preferred embodiment of the present invention, a laminated substrate includes a laminated member having a plurality of laminated dielectric layers, center electrode connecting electrodes disposed on the surface of the laminated member to be electrically connected to the center electrodes of a nonreciprocal circuit element, and at least two capacitor electrodes disposed inside of the laminated member, the at least two capacitor electrodes being opposed to each other with one of the dielectric layers being interposed between the capacitor electrodes to define a capacitor, and the capacitor being electrically connected to one of the center electrode connecting electrodes, and the at least one of the at least two capacitor electrodes defining a trimming capacitor electrode. The laminated member may include a terminal resistor therein.

According to another preferred embodiment of the present invention, a method of manufacturing a laminated substrate includes the steps of laminating a plurality of dielectric layers, at least two capacitor electrodes, and a center electrode connecting electrodes electrically connected to the center electrodes of a nonreciprocal circuit element to form a laminated member in which the center electrode connecting electrodes are provided on the surface thereon and the at least two capacitor electrodes are provided inside thereof, and trimming at least one of the at least two capacitor electrodes together with the dielectric of the surface layer. The trimming may be carried out using a laser.

According to the above-described configuration and method steps, the areas of the capacitor electrodes which can be trimmed are greatly increased, and the range in which the electrostatic capacitances can be become larger, and the acceptance ratio of the laminated substrates is high, since the trimming capacitor electrodes are provided inside of the laminated member. The bare essential electrodes such as the center electrode connecting electrodes or the like to be electrically connected to the center electrodes of the nonreciprocal circuit element are provided on the surface of the laminated substrate. Thus, this configuration effectively eliminates the need to use an electroconductive material such as solder or the like. Accordingly, inconveniences in which the electroconductive material such as solder flows into the trimming grooves so that the separated trimming capacitor electrodes are connected again can be prevented. Thus, the nonreciprocal circuit element and the communication device having high quality performances, high reliabilities and small sizes are obtained.

Preferably, the trimming capacitor electrode is positioned on the outermost layer in the at least two capacitors. As a result, the thickness of the dielectric layer over which the layer is removed by trimming can be set at the smallest possible vale. The trimming capacitor electrode may be the hot-side capacitor electrode of the capacitor. Moreover, the trimming capacitor electrode may have a substantially rectangular or a substantially square shape, and thereby, the electrode width becomes constant. Thus, the adjustment of the electrostatic capacitances can be easily achieved.

Preferably, the trimming capacitor electrode overlaps only the center electrode connecting electrode in the lamination direction of the laminated member. Thereby, an electrode which would hinder the trimming can be positioned so that the electrode and the trimming capacitor electrode are prevented from overlapping each other.

Preferably, the capacitors are an input-side matching capacitor, an output-side matching capacitor, and a terminal resistor side matching capacitor, and the hot-side capacitor electrode of the terminal resistor side matching capacitor is arranged on the terminal resistor side of the laminated member, the hot-side capacitor electrode of the input-side matching capacitor is arranged on the input-side of the laminated member, and the hot-side capacitor electrode of the output-side of matching capacitor is arranged on the output-side of the laminated member. According to the above-described configuration, the adjustment by trimming can be easily performed, and the capacitors each effectively using the area of the laminated member can be obtained.

According to other preferred embodiments of the present invention, a nonreciprocal circuit element and a communication device are provided and include with the above-described novel laminated member. Thus, the performances and the reliabilities of the nonreciprocal circuit element and the communication device are high.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
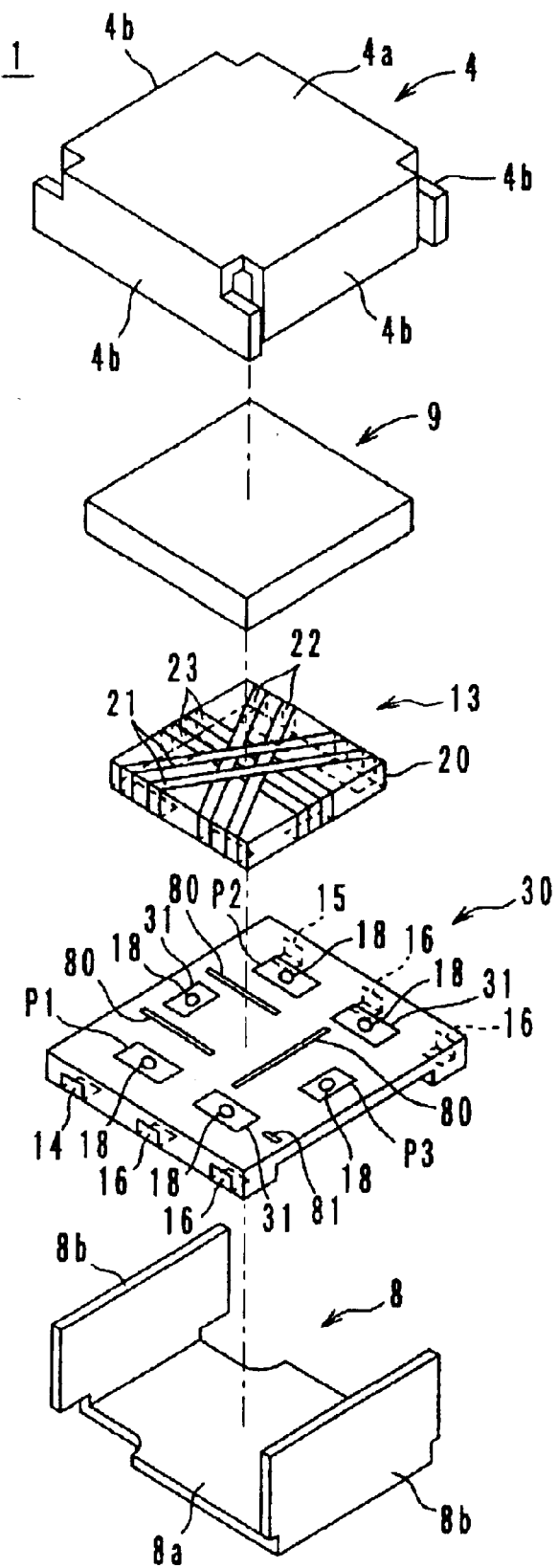
FIG. 1 is an exploded perspective view of a nonreciprocal circuit element according to a preferred embodiment of the present invention.

FIG. 1 is an exploded perspective view of a nonreciprocal circuit element according to a preferred embodiment of the present invention. A nonreciprocal circuit element 1 is preferably a lumped element isolator. As shown in FIG. 1, the lumped element isolator 1 preferably includes a metallic case having a metallic upper case 4 and a metallic lower case 8, a permanent magnet 9, a center electrode assembly member 13 including a ferrite 20, center electrodes 21 to 23, and a laminated substrate 30.

The metallic upper case 4 has a substantially box-shape and includes an upper portion 4a and four sides 4b. The metallic lower case 8 includes a right and left-side 8b and a bottom 8a. The metallic upper case 4 and the metallic lower case 8 define a magnetic circuit, and are preferably made of ferromagnetic material such as soft iron. The surface thereof is plated with Ag or Cu.

In the center electrode assembly member 13, three center electrodes 21 to 23 are arranged on the upper surface of the substantially rectangular-shape microwave ferrite 20 in such a manner that the center electrodes 21 to 23 intersect each other substantially at an angle of about 120° relative to each other with insulation layers (not shown) being interposed between the center electrodes 21 to 23. According to the first preferred embodiment, the center electrodes 21 to 23 each preferably include two lines. The center electrodes 21 to 23 may be formed by winding copper foils around the ferrite 20 or by printing silver paste on or inside of the ferrite 20. It should be noted that the printed center electrodes 21 to 23 have a higher positional accuracy, so that the connection of the center electrodes 21 to 23 to the laminated substrate becomes more stable. In particular, when the connection is carried out through small-sized center electrode connecting electrodes P1 to P3 (described later) as shown in FIG. 1, it is preferred to form the center electrodes 21 to 23 by printing due to the high reliability and workability.

Figure 2:
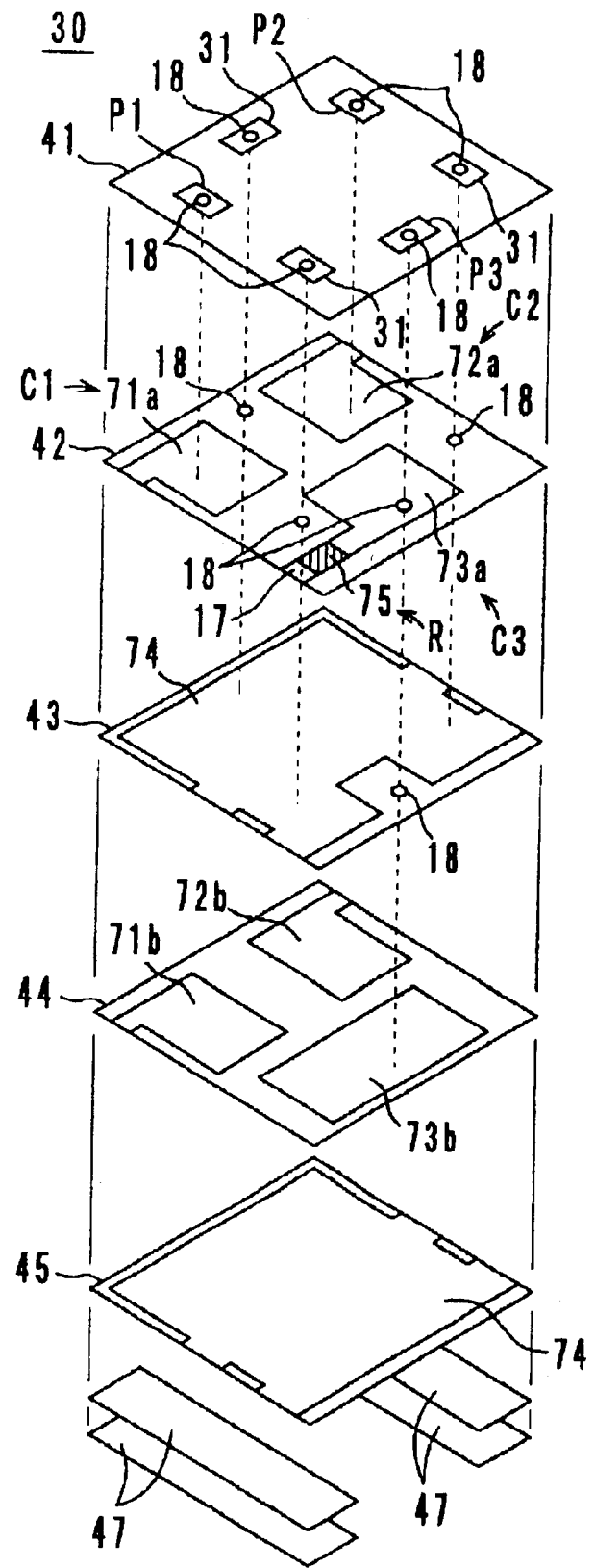
FIG. 2 is an exploded perspective view of the laminated substrate shown in FIG. 1.
Figure 3:
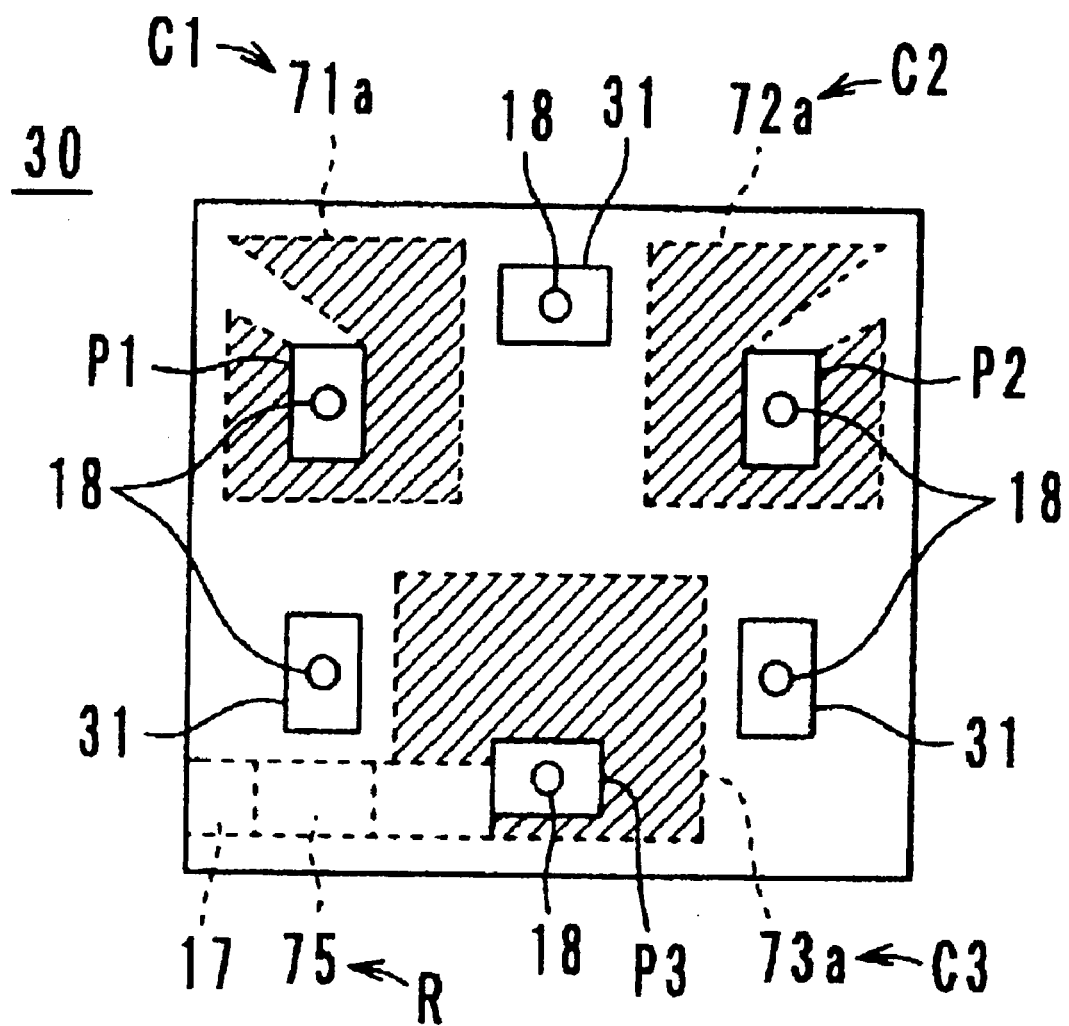
FIG. 3 is a plan view of the laminated substrate showing the areas of the capacitor electrodes which can be trimmed.

As shown in FIG. 2, the laminated substrate 30 includes a dielectric sheet 41 having the center electrode connecting electrodes P1 to P3 and viaholes 18 formed therein, a dielectric sheet 42 having hot-side capacitor electrodes 71a to 73a, a circuit electrode 17, a resistor 75, and so forth formed on the surface thereof, a dielectric sheet 44 having hot-side capacitor electrodes 71b to 73b disposed on the surface thereof, and dielectric sheets 43 and 45 each having a ground electrode 74 disposed on the surface thereof. Moreover, a ground electrode to be soldered to the lower case 8 is disposed on the back surface of the dielectric sheet 45.

The electrodes P1 to P3, 17, 31, 71a to 73a, 71b to 73b, and 74 are formed on the dielectric sheets 41 to 45 by pattern-printing or other suitable process, respectively. As materials of the electrodes P1 to P3 and so forth, Ag, Cu, Ag—Pd, and other suitable materials are preferably used, since they have a low resistivity and can be sintered simultaneously with the dielectric sheets 41 to 45. The surfaces of the electrodes P1 t P3 and so forth are plated with Au while a Ni plating is applied as an undercoat. The Ni plating increases the fixing strength between the Ag of the electrodes P1 to P3 and the Au plating. The Au plating can improve the solder wettability, and can reduce the loss of the isolator 1 due to the high electro-conductivity.

The thickness of the electrodes P1 to P3 is preferably in the range of about 2 $\mu$m to about 20 $\mu$m. The material for the dielectric sheets 41 to 45 is preferably a low-temperature sintering dielectric material containing as a major component $Al_2O_3$, and as sub-components, at least one of $SiO_2$, SrO, CaO, PbO, $Na_2O$, $K_2O$, MgO, BaO, $CeO_2$, and $B_2O_3$. The thicknesses of the dielectric sheets 41 to 45 are preferably in the range of about 10 $\mu$m to about 200 $\mu$m.

The resistor 75 is formed on the surface of the dielectric sheet 42 by pattern-printing or other suitable process. Cermet, carbon, ruthenium, or other suitable material is preferably used as a material for the resistor 75. The resistor 75 alone defines a terminal resistor R.

The viaholes 18 are produced by preliminarily forming holes for the viaholes in the dielectric sheets 41 to 45, e.g., by laser or punching processing, or other suitable process, and thereafter, filling electro-conductive paste into the holes.

The capacitor electrodes 71a, 71b, 72a, 72b, 73a, and 73b are opposed to the ground electrodes 74 with the dielectric sheets 42 to 44 being interposed between them, respectively, and thereby, the matching capacitors C1, C2, and C3 are formed. The matching capacitors C1, C2, and C3 and the terminal resistor R together with the electrodes P1 to P3 and the viaholes 18 define an electric circuit inside of the laminated substrate 30.

The dielectric sheets 41 to 45 are laminated, and at least two dummy dielectric sheets 47 having no electrodes preliminarily formed thereon are laminated to the lower surface of the formed laminate, and thereafter, are fired to be integrated. Thus, the laminated substrate 30 shown in FIG. 1 is produced. An input terminal electrode 14, an output terminal electrode 15, and ground terminal electrodes 16 are disposed on both side surfaces of the laminated substrate 30. The input terminal electrode 14 is electrically connected to the capacitor electrodes 71a and 71b. The output terminal electrode 15 is electrically connected to the capacitor electrodes 72a and 72b. The ground terminal electrodes 16 are electrically connected to the circuit electrode 17 and the ground electrodes 14, respectively. These terminal electrodes 14 to 16 are formed, e.g., by applying electroconductive paste containing Ag, Ag—Pd, Cu, or other suitable material, and firing or by dry plating, or other suitable process. Moreover, the electrodes 14 to 16 may be provided by forming viaholes in the sides of the respective dielectric sheets.

Figure 5:
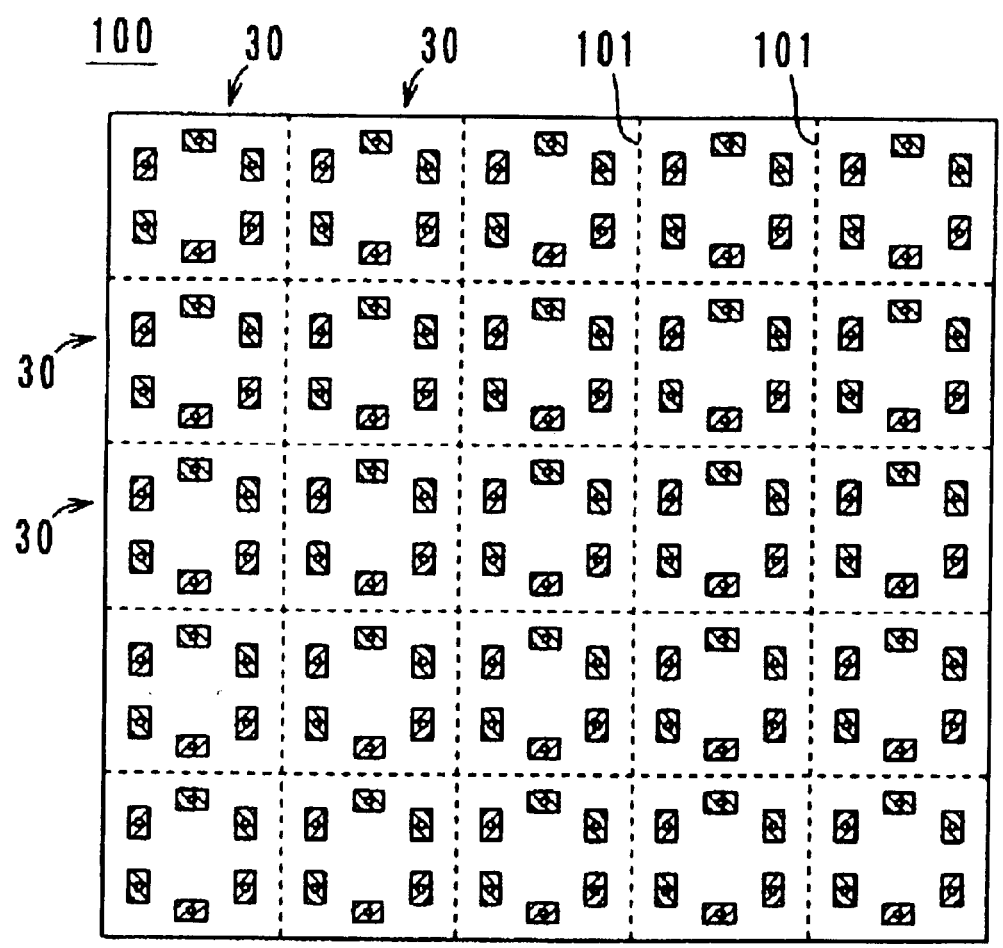
FIG. 5 is a plan view of laminated substrates in the state of a mother board.
Figure 6:
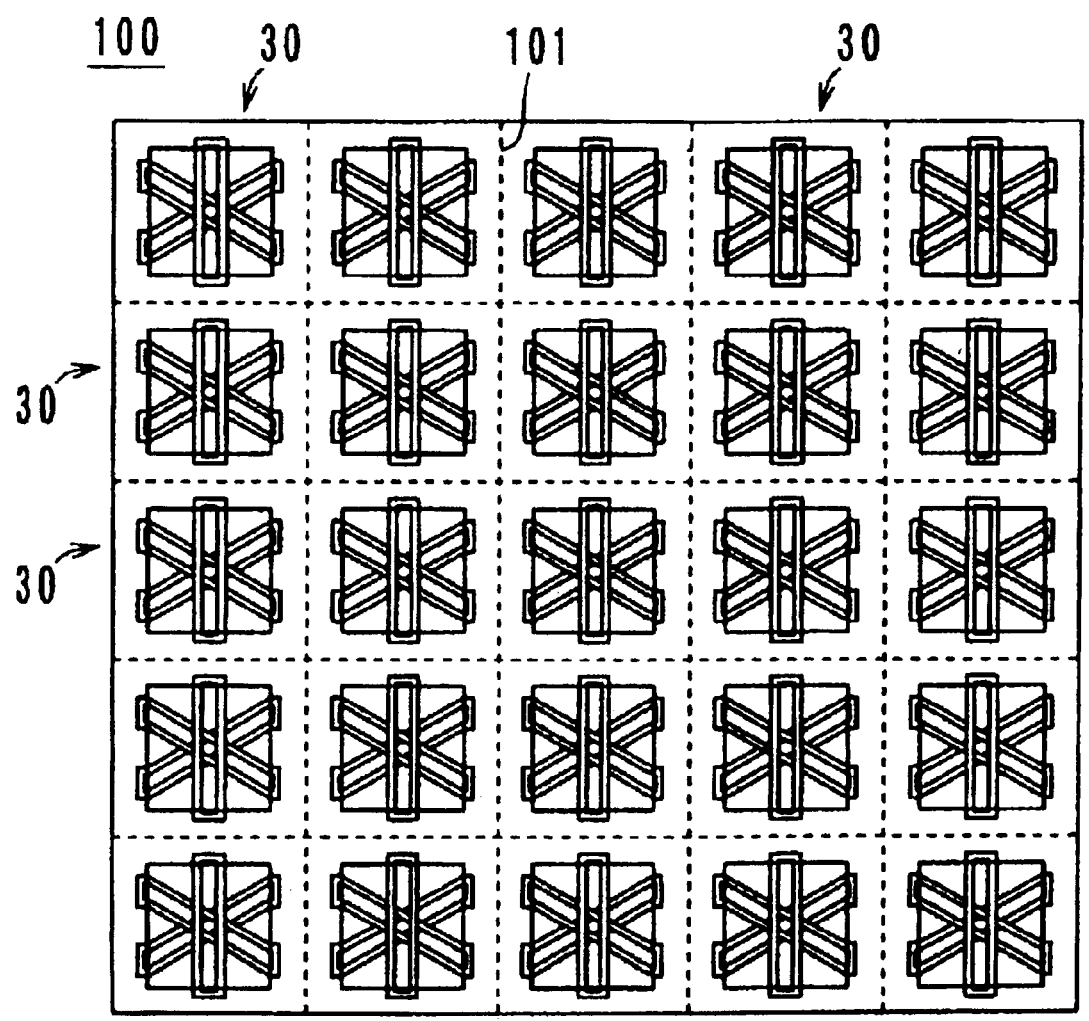
FIG. 6 is a plan view of the laminated substrates shown in FIG. 5, having components mounted thereon.

Ordinarily, the laminated substrates 30 are provided in the form of a mother board (see FIGS. 5 and 6). Half-cut grooves 101 are formed so as to have a predetermined pitch. The mother board 100 is bent and broken so that the laminated substrates 30 each having a desired size are formed. Alternatively, the mother board 100 may be cut by a dicer or a laser, so that the laminated substrates 30 each having a desired size can be obtained.

The laminated substrate 30 formed in the above-described manner has the matching capacitors C1 to C3 and the terminal resistor R provided inside thereof. The matching capacitors C1 to C3 are trimmed before the matching capacitors C1 to C3 are connected to the center electrodes 21 to 23, respectively.

That is, while the laminated substrate 30 is in the single state, the capacitor electrodes 71a, 72a, and 73a formed inside of the substrate 30 are trimmed (removed) together with the dielectric of the surface layer. For trimming, for example, a cutting device or laser beams having a fundamental wave, the second harmonic or the third harmonic is preferably used. When the laser is used, the processing can be performed at high speed and with great precision. The trimming may be efficiently carried out while in the laminated substrates 30 are in the mother board state.

The areas of the capacitor electrodes in which the trimming can be carried out are defined by excluding from the areas of the trimming capacitor electrodes 71a, 72a, and 73a both of the areas of the center electrode connecting electrodes P1 to P3 and the areas of a portion of the respective electrodes 71a, 72a, and 73a through which the center electrode connecting electrodes P1 to P3 are connected to the terminal electrodes 14 to 16. Since the trimming capacitor electrodes 71a to 73a are provided inside of the laminated substrate 30, the areas of a portion of the capacitor electrodes 71a to 73a which can be trimmed are increased. Thus, the range in which the electrostatic capacitances can be adjusted is increased. Thus, the acceptance ratio of the laminated substrates 30 can be improved.

Moreover, only the connecting electrodes P1 to P3 and 31 that are bare essentials are provided on the surface of the laminated substrate 30. No conductive materials such as solder are spread or provided thereon. Accordingly, inconveniences in which the conductive material flows into the trimming grooves (see FIG. 4) so that the cut and separated trimming capacitor electrodes are connected again are reliably prevented. Moreover, the distances between the connecting electrodes P1 to P3 and 31 can be significantly increased. Thus, the size of the center electrode assembly member 13 can be increased. Accordingly, the inductances produced by the center electrodes 21 to 23 become large. Thus, the pass-band width of the isolator 1 can be increased, and the electrical characteristics thereof can be improved.

The capacitor electrodes 71a, 72a, and 73a which are positioned on the outer-side layer compared to the capacitor electrodes 71b, 72b, and 73b are preferably used as trimming capacitor electrodes. Accordingly, the thickness of the dielectric layer which is removed by trimming can be as small as possible. Furthermore, the number of electrodes which hinder the trimming can be reduced (according to the first embodiment, only the connecting electrodes P1 to P3 and 31 are provided on the layer). Thus, the capacitor electrode areas which can be trimmed are increased, and the range of the electrostatic capacitance in which they can be adjusted is increased.

Moreover, the widths of the trimming capacitor electrodes 71a to 73a can be set at a constant value by formation of the trimming capacitor electrodes 71a to 73a having a substantially rectangular shape. Accordingly, a substantially proportional relationship holds between the positions of the trimming grooves 80 and the produced electrostatic capacitances. Thus, adjustment of the electrostatic capacitances can be easily achieved.

Moreover, the trimming capacitor electrodes 71a to 73a overlap only the center electrode connecting electrodes P1 to P3 in the lamination direction of the dielectric sheets 41 to 45. Thereby, other electrodes which will hinder the trimming can be positioned so as not to overlap the trimming capacitor electrodes 71a to 73a. If the trimming capacitor electrodes 71a to 73a overlap the ground connecting electrodes 31, electrostatic capacitances will be produced in the overlapped portions thereof. Thus, inconveniently, the trimming accuracy will be deteriorated.

Figure 4:
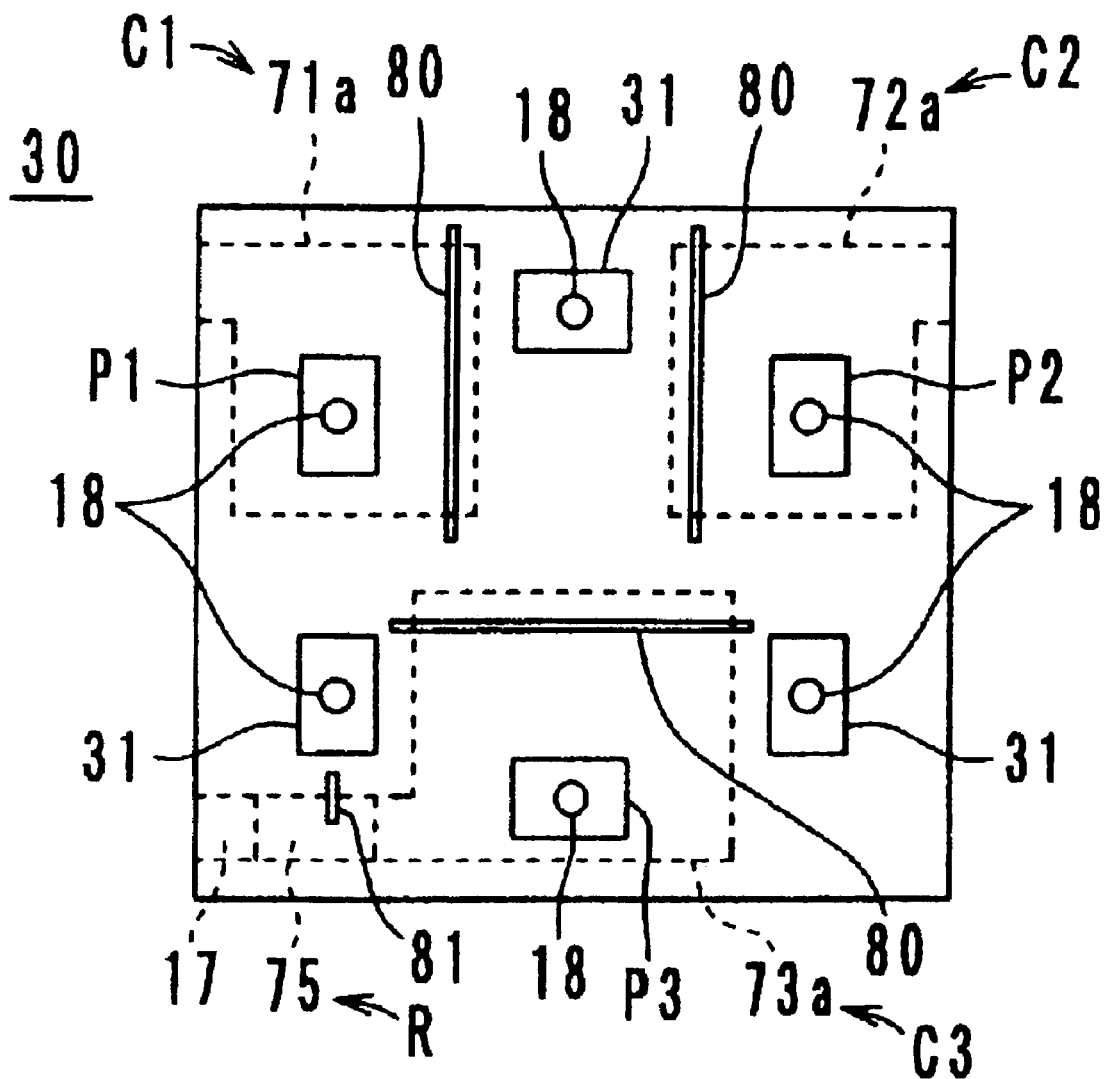
FIG. 4 is a plan view of the laminated substrate showing an example of the formed trimming grooves thereof.

When seen in the depiction of FIG. 4, in the laminated substrate 30, the hot-side capacitor electrodes 73a and 73b of the matching capacitor C3 are provided in the lower portion of the laminated element, the hot-side capacitor electrodes 71a and 71b of the matching capacitor C1 are provided in the left-upper portion thereof, and the hot-side capacitor electrodes 72a and 72b are provided in the right-upper portion thereof. In other words, the hot-side capacitor electrodes 73a and 73b of the terminal resistor side matching capacitor C3 are arranged on the side where the terminal resistor R of the laminated substrate 30 is provided. The hot-side capacitor electrodes 71a and 71b of the input-side matching capacitor C1 are arranged on the input side of the laminated substrate 30. The hot-side capacitor electrodes 72a and 72b of the output-side matching capacitor C2 are arranged on the output side of the laminated substrate 30. Thereby, the trimming for adjustment can be easily carried out. The matching capacitors C1 to C3 can be obtained by effectively using the area of the laminated substrate 30.

Generally, for isolators used in mobile communication devices, in many cases, the electrostatic capacitance of the resistor-side matching capacitor C3 is larger than that of each of the input and output matching capacitors C1 and C2. Accordingly, to secure the electrostatic capacitance of the resistor-side matching capacitor C3, the area of the hot-side capacitor electrodes 73a and 73b of the matching capacitor C3 is required to be at least one-third of the total area of the hot-side capacitor electrodes of the matching capacitors C1 to C3.

Moreover, the terminal resistor R is included in the laminated substrate 30. Accordingly, the resistance of the terminal resistor R can be adjusted by trimming the resistor R together with the surface layer of the dielectric. Even if only one portion of the resistor 75 becomes thin, the resistance will be increased. Therefore, the resistor 75 is scraped off to along the way in the width direction thereof. Also, since the terminal resistor R is included in the laminated substrate 30, neither Ni nor Au is plated by accident when the Ni or Au plating is carried out. That is, the resistance of the terminal resistor R is prevented from decreasing. According to the first preferred embodiment of the present invention, as shown in FIG. 4, three trimming grooves 80 are formed so as to cut and separate the trimming capacitor electrodes 71a to 73a, and a trimming groove 81 is provided in the form of a slit for the resistor 75 in the laminated substrate 30.

The above-described components are constructed as follows. That is, as shown in FIG. 1, the permanent magnet 9 is fixed to the inner surface of the metallic upper case 4 preferably via an adhesive. The center electrode assembly member 13 is mounted onto the laminated substrate 30 as follows. First ends of the respective center electrodes 21 to 23 of the center electrode assembly member 13 are soldered to the center electrode connecting electrodes P1 to P3 disposed on the surface of the laminated substrate 30. Second ends of the respective center electrodes 21 to 23 are soldered onto the ground connecting electrodes 31. Since the areas of the connecting electrodes P1 to P3 and 31 are small, a self-alignment effect is generated when the solder is melted. Thereby, the center electrode assembly member 13 can be positioned.

The bare essential portions on both ends of the respective center electrodes 21 to 23 are extended onto the bottom of the ferrite 20. Therefore, the center electrodes 21 to 23 are prevented from intersecting the trimming grooves 80 and 81 on the upper surface of the laminated substrate 30. Accordingly, the solder is prevented from flowing into the trimming grooves 80 and 81 via the center electrodes 21 to 23 on the bottom of the ferrite 20. Thus, the reliability is high. The soldering of the center electrodes 21 to 23 to the connecting electrodes P1 to P3, and 31 may be efficiently carried out by use of the laminated substrates 30 in the form of a mother board.

The laminated substrate 30 is disposed on the bottom 8a of the metallic lower case 8. An electrode formed on the back surface of the sheet 47 is soldered to be connected and fixed to the bottom 8a, whereby the ground terminal electrodes 16 are electrically connected to the bottom 8a. Thereby, the grounding becomes satisfactory, so that the electrical characteristics of the isolator 1 can be improved.

The sides 8a of the metallic lower case 8 and the sides 4b of the metallic upper case 4 are bonded to each other by soldering or other suitable process to form a metallic case. The case also functions as a yoke. That is, the metallic case defines a magnetic path, which surrounds the permanent magnet 9, the center electrode assembly member 13, and the laminated substrate 30. The permanent magnet 9 applies a DC magnetic field to the ferrite 20.

Figure 7:
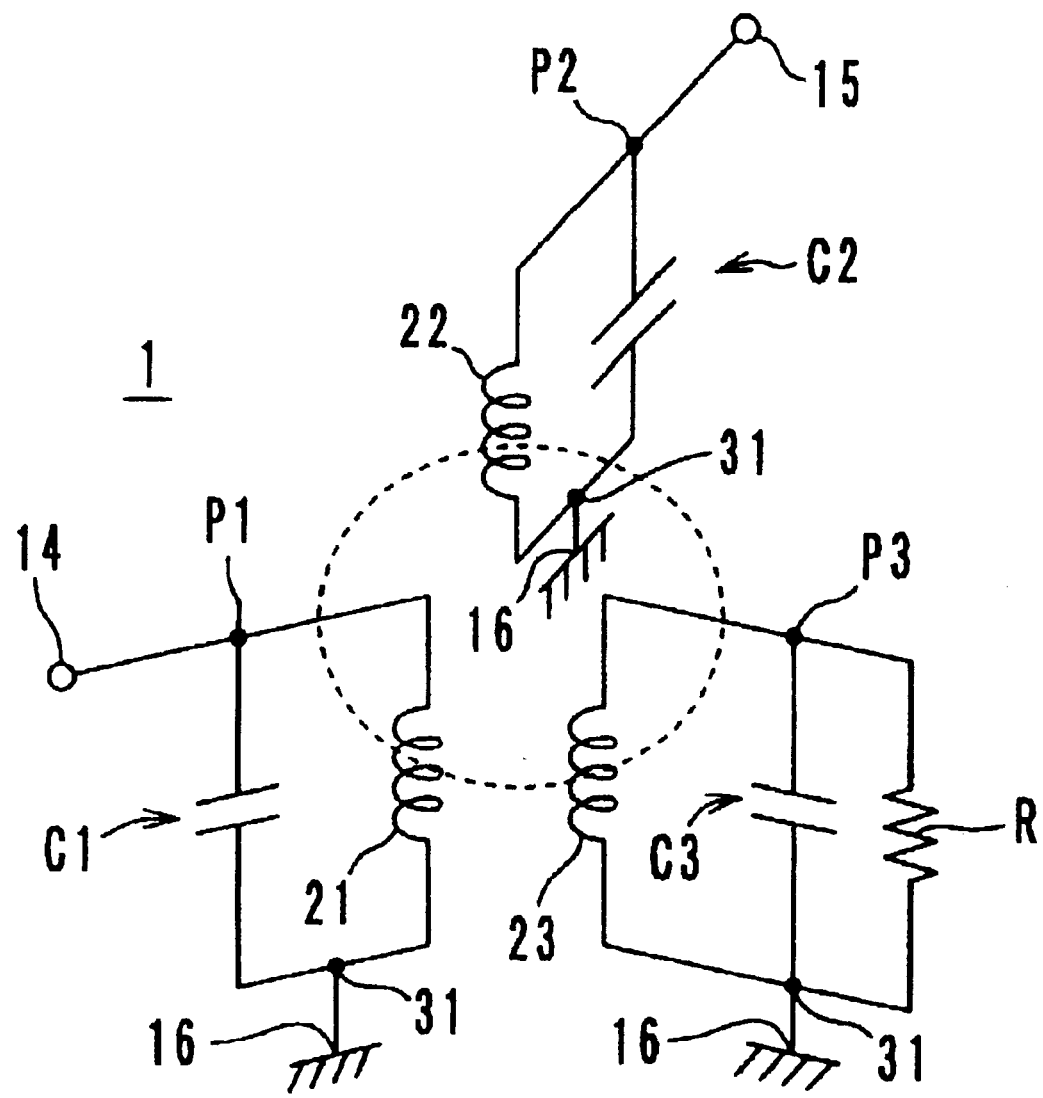
FIG. 7 is an electrical equivalent circuit diagram of the nonreciprocal circuit element shown in FIG. 1.

FIG. 7 is an electrical equivalent circuit diagram of the isolator. The matching capacitor C3 and the terminal resistor R are connected in parallel to each other between the center electrode connecting electrode P3 and the ground terminal electrode 16.

Second Preferred Embodiment

Figure 8:
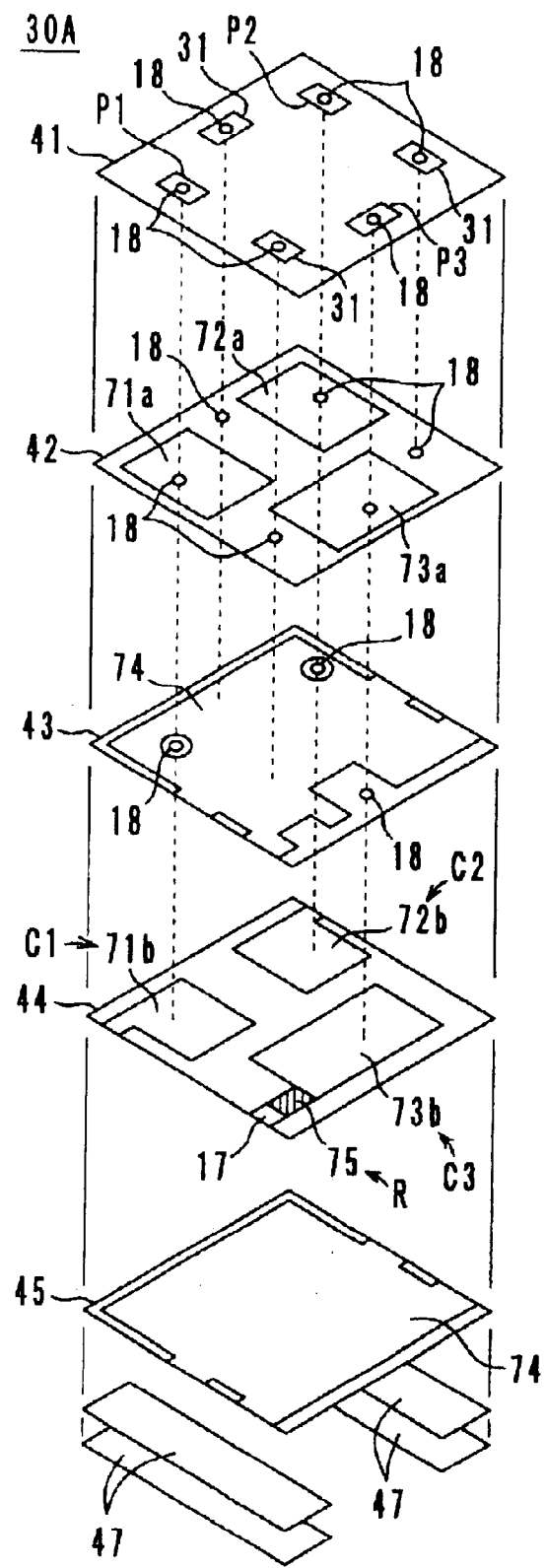
FIG. 8 is an exploded perspective view of a laminated substrate according to yet another preferred embodiment of the present invention.

FIG. 8 is an exploded perspective view showing another preferred embodiment of the laminated substrate. In a laminated substrate 30A, the trimming capacitor electrodes 71a to 73a are connected to the terminals 14 to 16 via the viaholes 18, the capacitor electrodes 71b to 73b, the resistor 75, and the circuit electrode 17.

Figure 9:
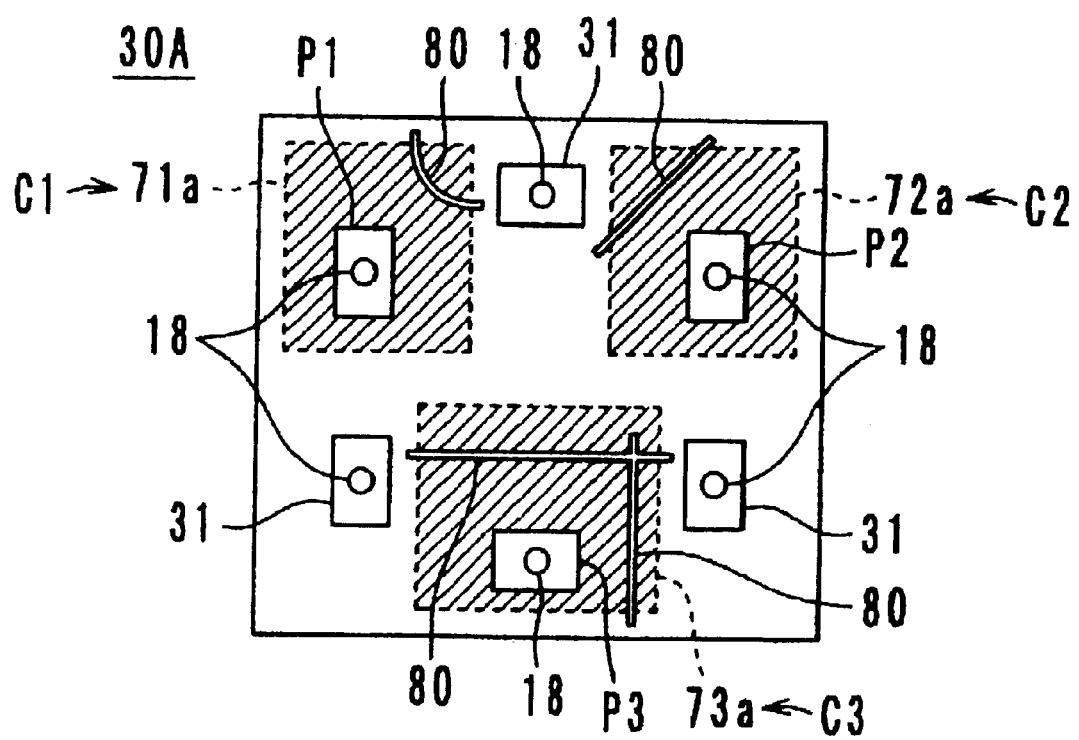
FIG. 9 is a plan view of the laminated substrate showing the areas of the capacitor electrodes which can be trimmed.

The areas of the capacitor electrodes which can be trimmed are shown by the shaded portions in FIG. 9. That is, the areas are determined by excluding the areas of the center electrode connecting electrodes P1 to P3 from the areas of the trimming capacitor electrodes 71a, 72a, and 73a. Accordingly, the laminated substrate 30a has the same advantages as the laminated substrate 30. The areas of a portion of the capacitor electrodes of the laminated substrate 30a which can be trimmed are larger than those of the laminated substrate 30. The range of the electrostatic capacitances can be adjusted more widely. The acceptance ratio is further improved.

Third Preferred Embodiment

Figure 10:
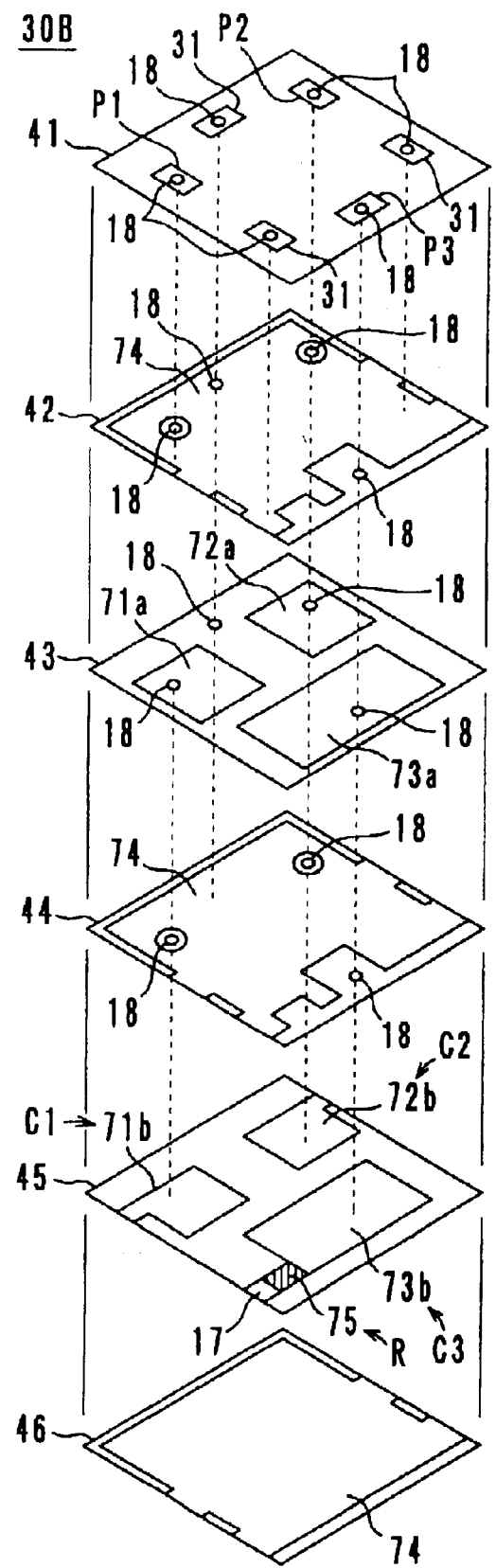
FIG. 10 is an exploded perspective view of a laminated substrate according to another preferred embodiment of the present invention.
Figure 11:
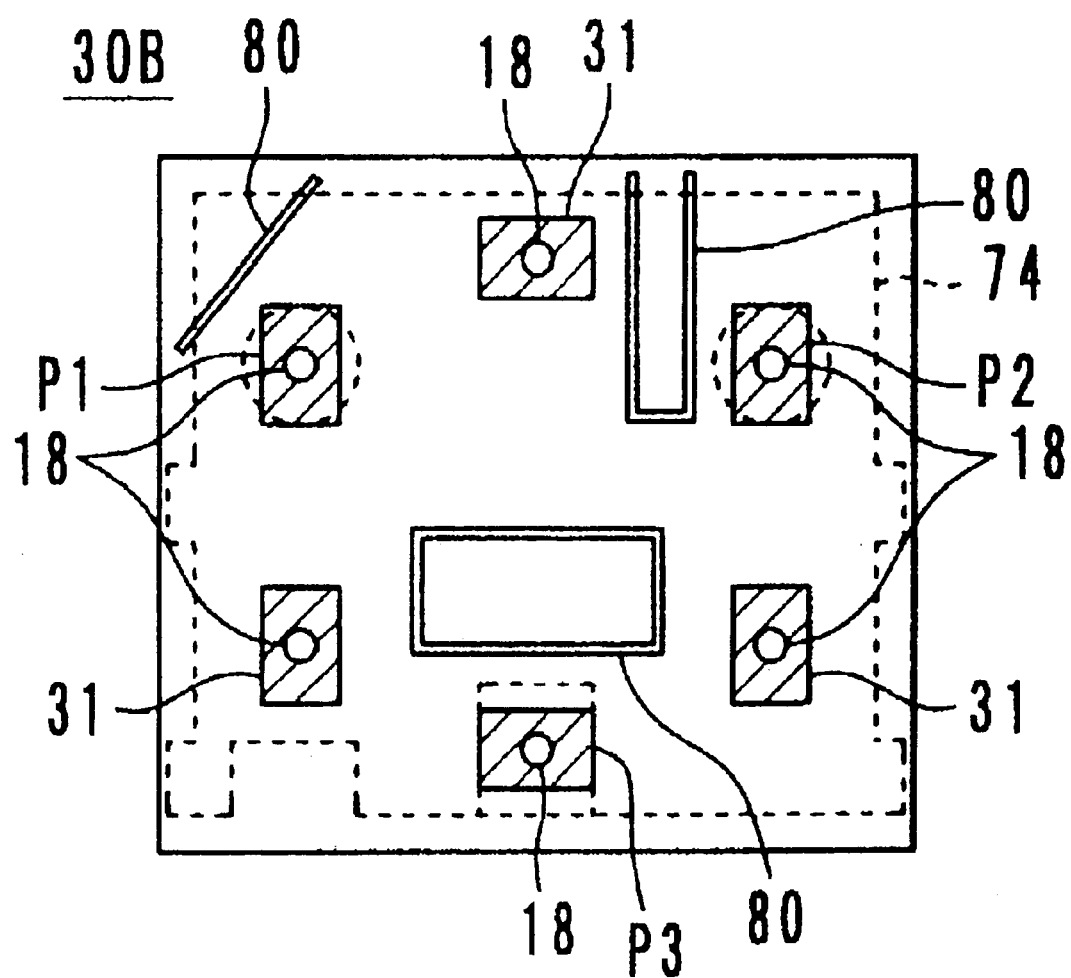
FIG. 11 is a plan view of the laminated substrate showing the areas of the capacitor electrodes which can be trimmed.

FIG. 10 is an exploded perspective view of a laminated substrate according to still another preferred embodiment of the present invention. In a laminated substrate 30B, the ground electrode 74 (cold-side capacitor electrode) disposed on the dielectric sheet 46 is used as a trimming electrode. In the laminated substrate 30B, the capacitor electrode area which can be trimmed is determined by excluding the areas of the connecting electrodes P1 to P3 and 31 represented by the shaded portions in FIG. 11 from the area of the ground electrode 74. As shown in FIG. 11, the trimming grooves 80 formed in the ground electrode 74 have a complicated pattern.

The sheets 47 as shown in FIG. 2 are laminated to the lowermost layer of the laminated substrate 30B, though they are not shown in FIG. 10.

Fourth Preferred Embodiment

Figure 12:
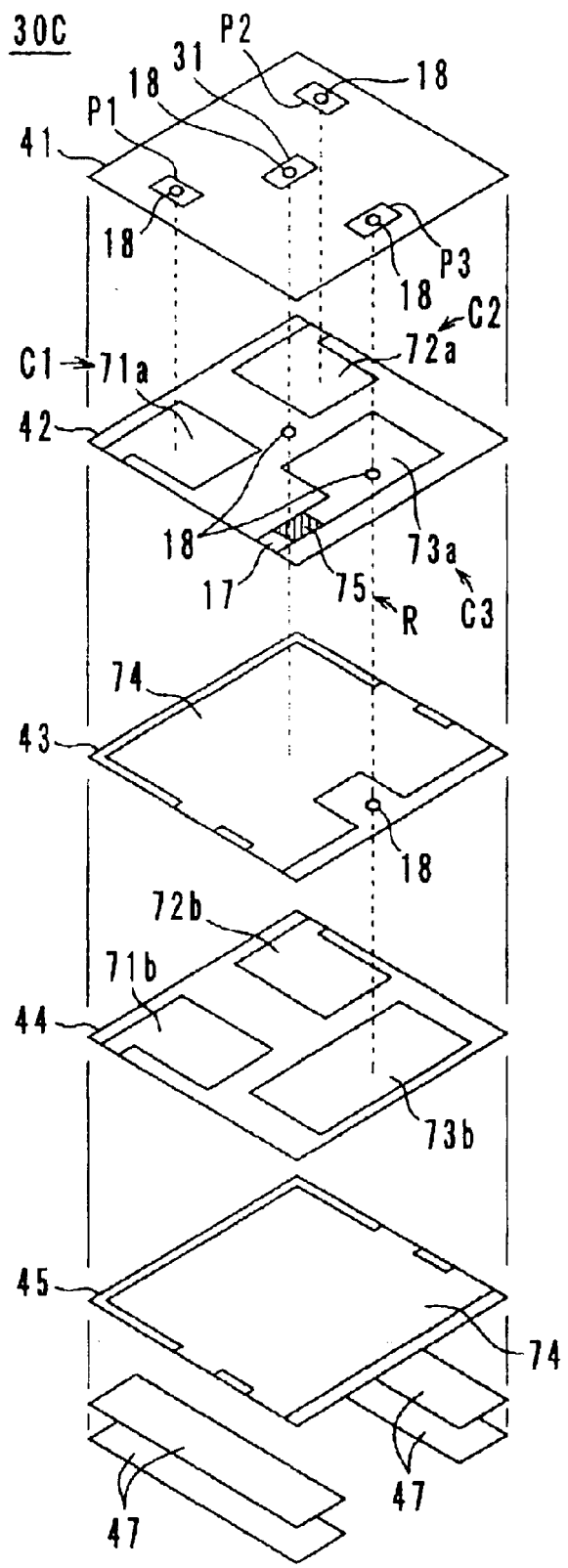
FIG. 12 is an exploded perspective view according to still another preferred embodiment of the present invention.
Figure 13:
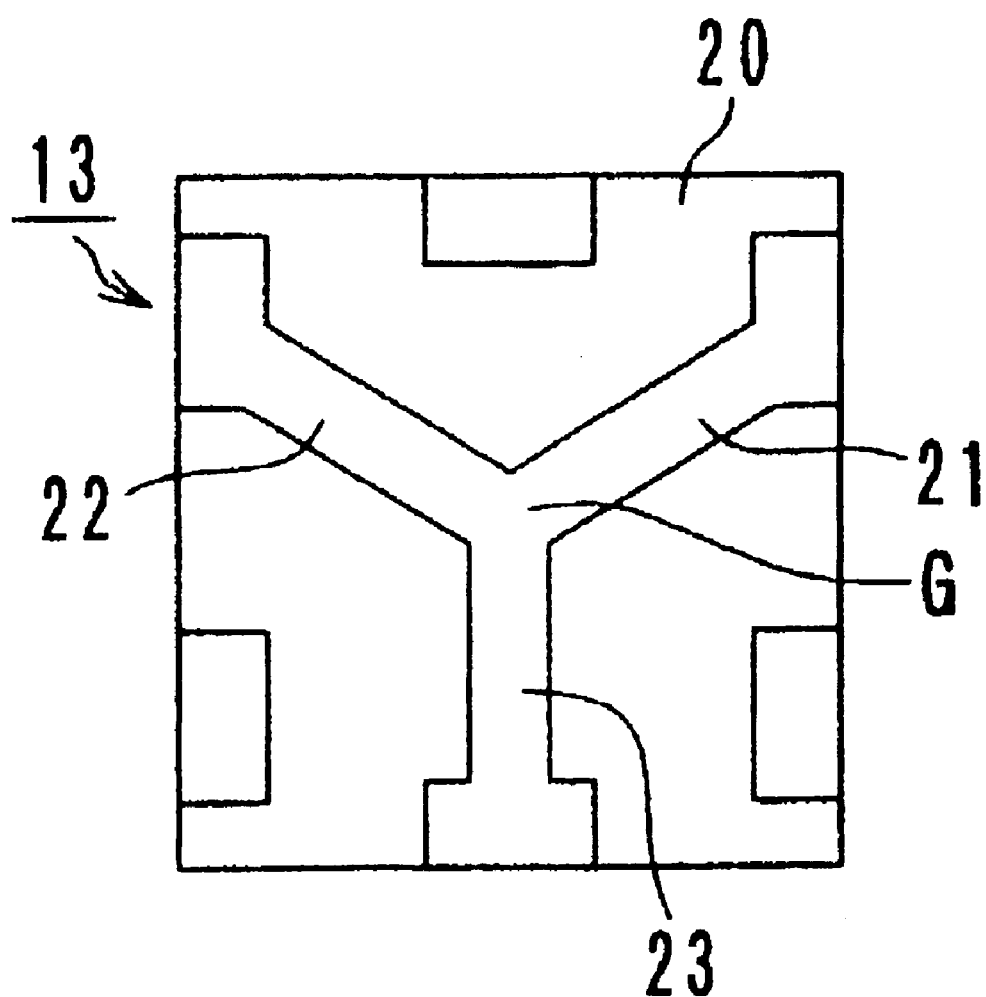
FIG. 13 is a bottom view of a center electrode assembly member.

FIG. 12 is an exploded perspective view of a laminated substrate according to another preferred embodiment of the present invention. In a laminated substrate 30C, one ground connection electrode 31 is provided on the surface thereof. Moreover, the ground-sides of the center electrodes 21 to 23 are connected together in the center G of the bottom of ferrite 20 of the center electrode assembly member 13 which is mounted onto the laminated substrate 30, as shown in FIG. 13. Thus, the center electrodes 21 to 23 of this center electrode assembly member 13 can be increased, and thereby, the inductances of the center electrodes 21 to 23 can be increased. Accordingly, the ranges in which the characteristics such as the isolation, the insertion loss, and so forth of the isolator are available can be increased. In addition, the number of the viaholes 18 formed in the laminated substrate 30c can be reduced, and the production cost can be decreased.

Fifth Preferred Embodiment

Figure 14:
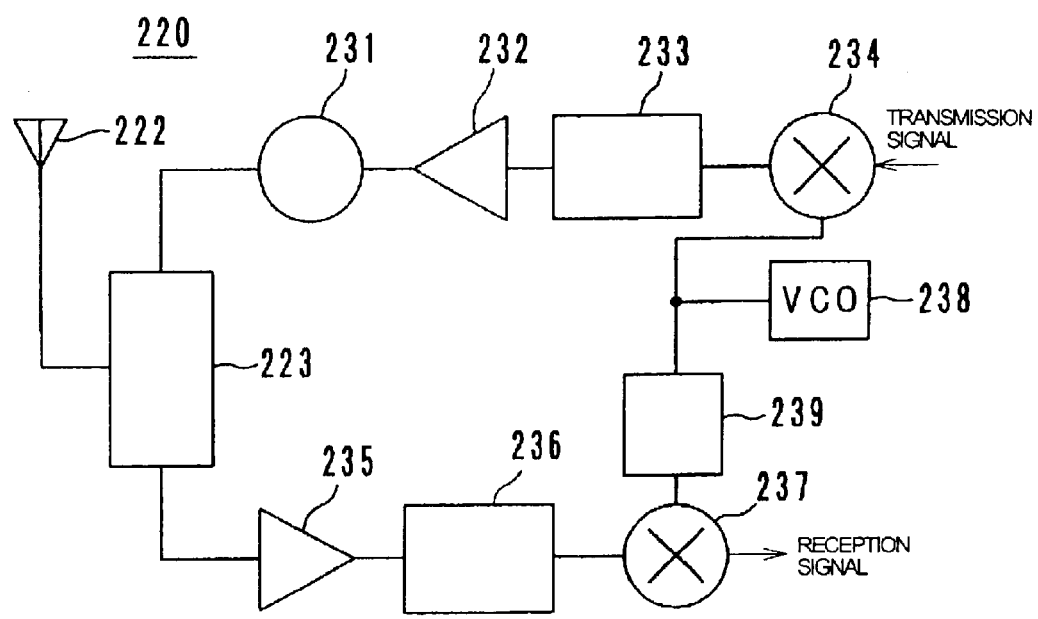
FIG. 14 is an electrical circuit block diagram of a communication device according to a preferred embodiment of the present invention.
Figure 15:
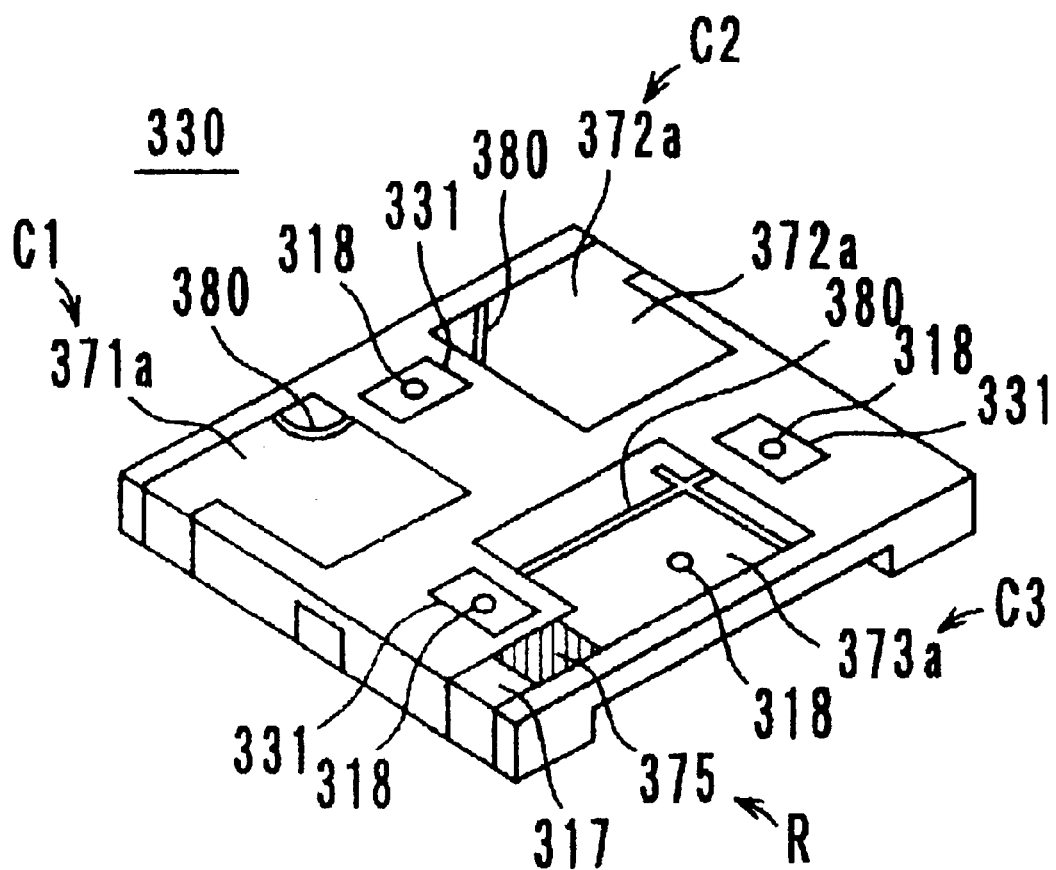
FIG. 15 is a perspective view showing the appearance of a related art laminated substrate.
Figure 16:
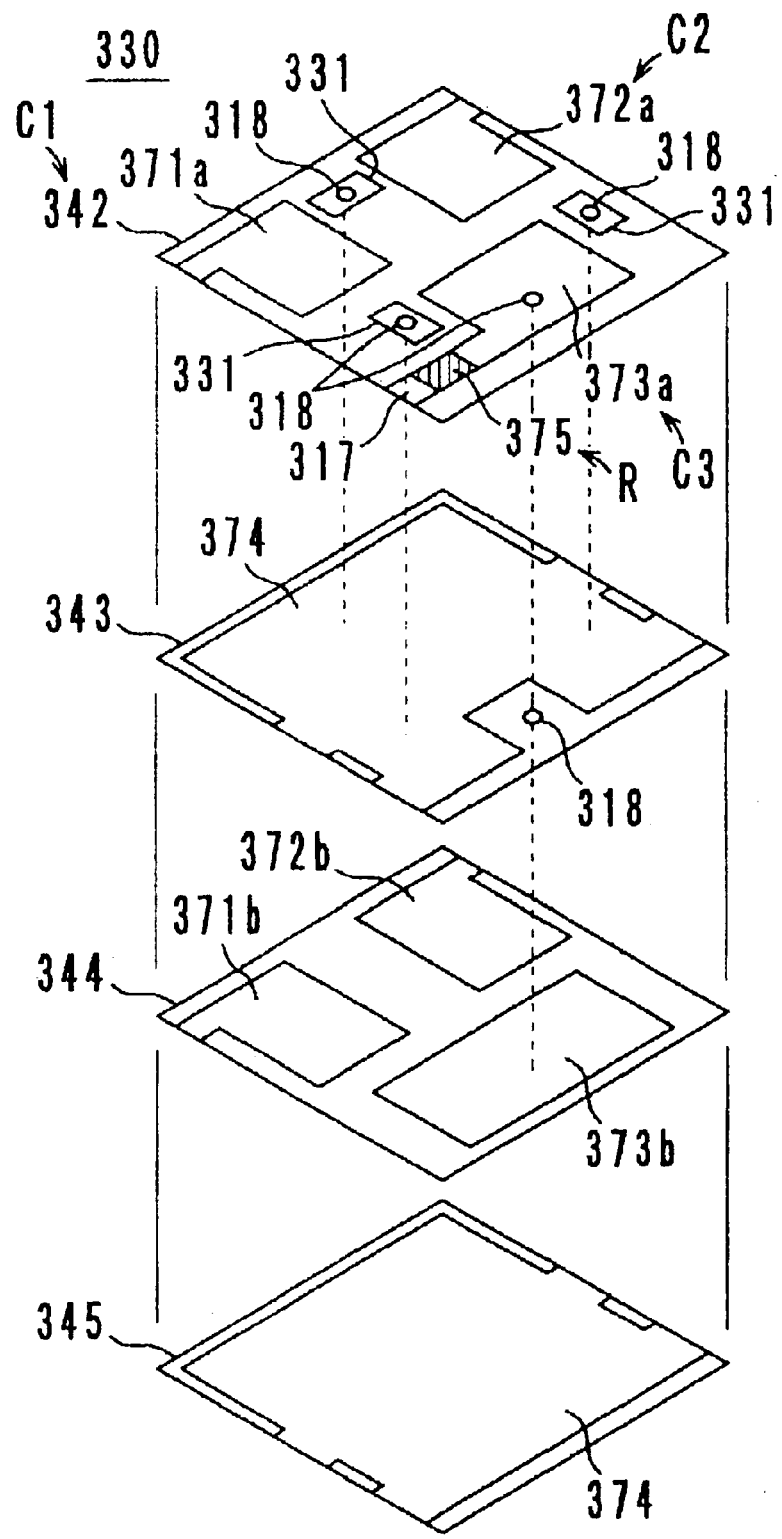
FIG. 16 is an exploded perspective view of the laminated substrate shown in FIG. 15.

FIG. 14 is a block diagram of an electric circuit of the RF unit of a portable telephone 220. In FIG. 14, an antenna element 222, a duplexer 223, a transmission-side isolator 231, a transmission-side amplifier 232, a transmission-side interstage band-pass filter 233, a transmission-side mixer 234, a reception-side amplifier 235, a reception-side interstage band-pass filter 236, a reception-side mixer 237, a voltage control oscillator (VCO) 238, and a local band-pass filter 239 are shown.

As the transmission-side isolator 231, the lumped element isolator 1 as used in the first preferred embodiment and another lumped element isolators including the laminated substrates 30A, 30B, and 30C according to the second to fourth preferred embodiments can be used. Portable telephones having improved electrical characteristics and a high reliability can be provided by mounting these isolators.

Other Preferred Embodiments

It is to be understood that the present invention is not restricted onto the above-described preferred embodiments, and can be changed without departing from the spirit of the invention. For example, the capacitors used in the above-described preferred embodiments include at least two hot-side capacitor electrodes and at least two ground electrodes, respectively. However, each capacitor may include one hot-side capacitor electrode and one ground electrode.

Moreover, the capacitors disposed inside of the laminated substrate are not limited to the matching capacitors. Capacitors for defining band-pass filters, a trap circuit, or other suitable filters or circuits may be disposed inside of the laminate substrate. Moreover, the non-reciprocal circuit element of the present invention may be a circulator, a coupler-containing non-reciprocal circuit element, or other suitable component.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A laminated substrate comprising:
   a laminated member including a plurality of laminated dielectric layers;
   center electrode connecting electrodes disposed on a surface of the laminated member to be electrically connected to center electrodes of a nonreciprocal circuit element; and
   at least two capacitor electrodes disposed inside of the laminated member;
   the at least two capacitor electrodes being opposed to each other with one of the dielectric layers being interposed between the at least two capacitor electrodes to define a capacitor, and the capacitor being electrically connected to one of the center electrode connecting electrodes, and the at least one of the at least two capacitor electrodes being a trimming capacitor electrode.

2. A laminated substrate according to claim 1, wherein the trimming capacitor electrode is positioned on an outermost layer of the at least two capacitor electrodes.

3. A laminated substrate according to claim 1, wherein the trimming capacitor electrode is a hot-side capacitor electrode of the capacitor.

4. A laminated substrate according to claim 1, wherein the trimming capacitor electrode has a substantially rectangular shape.

5. A laminated substrate according to claim 1, wherein the trimming capacitor electrode overlaps only the center electrode connecting electrodes in a direction in which the plurality of laminated dielectric layers of the laminated member are stacked and laminated.

6. A laminated substrate according to claim 1, wherein the laminated member includes a terminal resistor.

7. A laminated substrate according to claim 1, further comprising a plurality of capacitors in the laminated member, wherein the capacitors include an input-side matching capacitor, an output-side matching capacitor, and a terminal resistor side matching capacitor, the hot-side capacitor electrodes of the terminal resistor side matching capacitor are arranged on the terminal resistor side of the laminated member, the hot-side capacitor electrodes of the input-side matching capacitor are arranged on the input-side of the laminated member, and the hot-side capacitor electrodes of the output-side of matching capacitor are arranged on the output-side of the laminated member.

8. A laminated substrate according to claim 6, wherein the terminal resistor is included in the laminated substrate.

9. A laminated substrate according to claim 1, wherein at least one groove is formed in the trimming capacitor electrode.

10. A laminated substrate according to claim 1, further comprising a ground electrode disposed on one of the dielectric layers of the laminated member, wherein the ground electrode is a trimming electrode.

11. A nonreciprocal circuit element comprising:

the laminated substrate according to claim 1;

a ferrite to which the permanent magnet applies a DC magnetic field;

at least two center electrodes arranged on the ferrite; and connecting electrodes for the laminated substrate arranged on the ferrite.

12. A nonreciprocal circuit element according to claim 11, wherein the nonreciprocal circuit element is a lumped element isolator.

13. A communication device comprising the nonreciprocal circuit element according to claim 11.

14. A laminated substrate according to claim 12, wherein the communication device is a telephone.

* * * * *